United States Patent [19]

Nishiura et al.

[11] Patent Number: 5,068,581
[45] Date of Patent: Nov. 26, 1991

[54] HORIZONTAL DEFLECTION CIRCUIT FOR HIGH-FREQUENCY SCANNING

[75] Inventors: Akira Nishiura, Matumoto; Naoki Kumagai, Yokosuka; Yasukazu Seki, Kanagawa, all of Japan

[73] Assignee: Fuji Electric Co., Ltd., Japan

[21] Appl. No.: 573,635

[22] Filed: Aug. 27, 1990

[30] Foreign Application Priority Data

Aug. 30, 1989 [JP] Japan .................... 1-223503

[51] Int. Cl.$^5$ .................... G09G 1/04; H01J 29/70
[52] U.S. Cl. .................... 315/370; 315/408
[58] Field of Search ............ 315/408, 403, 370, 371

[56] References Cited

U.S. PATENT DOCUMENTS

| | | | |
|---|---|---|---|
| 2,896,115 | 7/1959 | Guggi | 315/408 |
| 4,677,352 | 6/1987 | Sibovits et al. | 315/408 |
| 4,864,197 | 9/1989 | Fitzgerald | 315/408 |

FOREIGN PATENT DOCUMENTS 545098  1/1977  U.S.S.R. .................... 315/370

Primary Examiner—Gregory C. Issing
Attorney, Agent, or Firm—Brumbaugh, Graves, Donohue & Raymond

[57] ABSTRACT

Horizontal deflection circuits are disclosed which permit high-frequency operation through use of conductivity modulation MOS FET devices. Distortion of the horizontal deflection coil voltage is avoided by inclusion of compensation means utilizing an inductance to produce delay in the increase in magnitude of current flow during reverse recovery current flow. Use of a compensation means including an inductor and diode in parallel combination provides additional benefits of oscillation suppression.

12 Claims, 3 Drawing Sheets

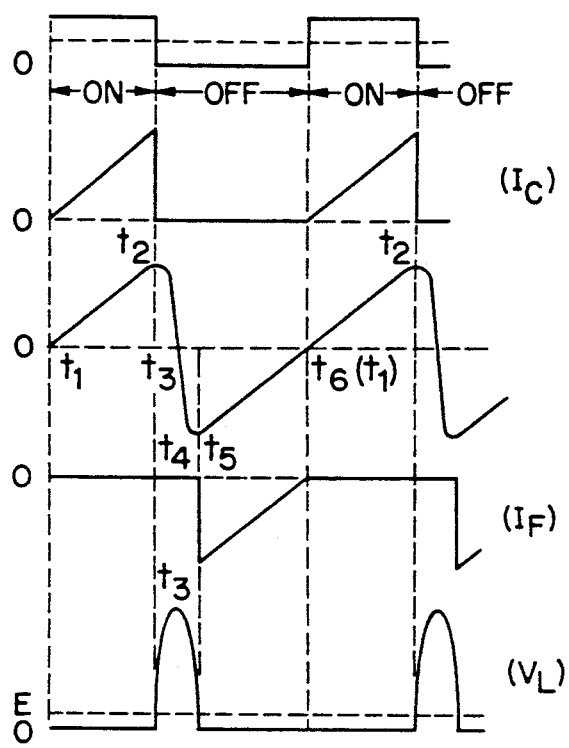
FIG. 9 (1)
FIG. 9 (2) ($I_C$)
FIG. 9 (3)
FIG. 9 (4) ($I_F$)
FIG. 9 (5) ($V_L$)
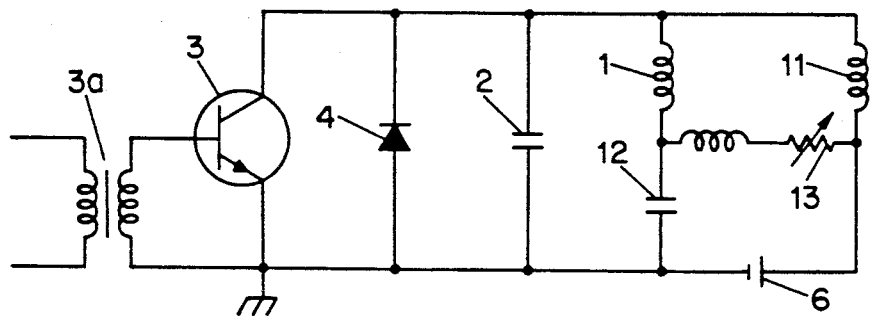
FIG. 10
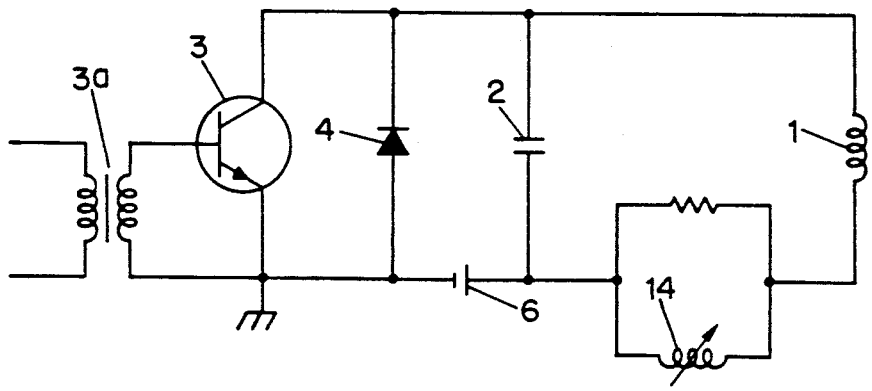
FIG. 11

HORIZONTAL DEFLECTION CIRCUIT FOR HIGH-FREQUENCY SCANNING

BACKGROUND OF THE INVENTION

The present invention relates to horizontal deflection circuits for use in a television set or video display unit. In particular, it relates to high-frequency horizontal deflection circuits for obtaining high picture quality.

Generally, a conventional horizontal deflection circuit of a television set or video display unit supplies sawtooth current at a repetitive frequency of 15.75 kHz to a horizontal deflection coil. FIG. 8 shows the fundamental horizontal deflection circuit in which a horizontal deflection coil 1, a tuning capacitor 2, a damper diode 4, and a switching element 3 are provided, a bipolar transistor normally being used as the switching element 3. FIG. 9 shows the control operation of the circuit. The bipolar transistor 3 is operated as a switch responsive to the base voltage in the pulse wave applied between the base and emitter by the control unit 3a (FIG. 9 (1)). When the switch closes at time $t_1$, the collector current, increasing linearly with time flows through the horizontal deflection coil 1. At this point, the tuning capacitor 2 is momentarily charged. Then, when the switch opens at time $t_2$, the current in the horizontal deflection coil 1 decreases to zero, charging the tuning capacitor ($t_3$). The tuning capacitor 2 then starts to discharge through the horizontal deflection coil 1. This reverses the current flowing through the horizontal deflection coil ($t_3-t_4$). Then, in the LC tuning circuit, which consists of only the horizontal deflection coil 1 and the tuning capacitor 2, charging of the tuning capacitor 2 starts in the reverse direction. However, due to the damper diode 4 operating in parallel with that circuit, the terminal voltage of the horizontal deflection coil 1 becomes higher than voltage E of the power source 6 immediately after the current in the horizontal deflection coil 1 exceeds the maximum value ($t_5$). This results in the application of forward voltage to the damper diode 4. Current in the horizontal deflection coil 1 flows through the damper diode (the damper current is shown in FIG. 9(4)), charging the power source 6, and the current then gradually decreases. When the current is zero, the switch closes again at time $t_6$ (corresponding to time $t_1$). By repeating this operation, sawtooth current is conducted through the horizontal deflection coil. FIG. 9(5) shows the voltage generated in the horizontal deflection coil at that time.

FIG. 8 shows the fundamental horizontal deflection circuit. In addition to this circuit, various other types of circuits have been proposed. FIG. 10 shows a circuit intended to produce what is called an S-shaped correction. This circuit corrects excessive elongation at both edges of the television screen. In addition to a horizontal deflection coil 1, a tuning capacitor 2, a switching element 3, and a damper diode 4, this circuit contains a choke coil 11, a correcting capacitor 12, and a horizontal positioning adjustment 13, with a power source 6 located in a different position from that of the circuit in FIG. 8. FIG. 11 shows a circuit which can be used to adjust the amplitude of the horizontal deflection coil current, because it is equipped with an amplitude adjusting coil 14 and other components. However, the principle of control of this circuit is the same as that of the circuit in FIG. 8.

It is therefore an object of the present invention to provide horizontal deflection circuits capable of high-frequency operation without distortion to the horizontal deflection coil voltage.

An additional object is to provide horizontal deflection circuits using conductivity modulation MOS FETs for high frequency operation, for example, with horizontal deflection frequencies of 30–60 kHz.

SUMMARY OF THE INVENTION

In accordance with the invention a horizontal deflection circuit includes a horizontal deflection coil, a tuning capacitor connected to the horizontal deflection coil, a damper diode, a switching element and compensation means, including an inductor, connected in series with the damper diode. The switching element may consist of a conductivity modulation MOS FET and sawtooth current is supplied to the horizontal deflection coil by the opening and closing of the switching element. The horizontal deflection circuit may employ a diode having the same polarity as the damper diode and connected in parallel to the inductor which is connected in series with the damper diode.

The present invention will be better understood from the following detailed description of the exemplary embodiments thereof taken in conjunction with the accompanying drawings, and its scope will be pointed out in the appended claims.

BRIEF DESCRIPTION OF THE DRAWINGS

FIG. 9(1)–9(5) are an explanatory drawing of the control operation of the circuit in FIG. 8.

FIGS. 10 and 11 are circuit diagrams of alternative forms of conventional horizontal deflection circuits.

DESCRIPTION OF THE INVENTION

Figure 5:
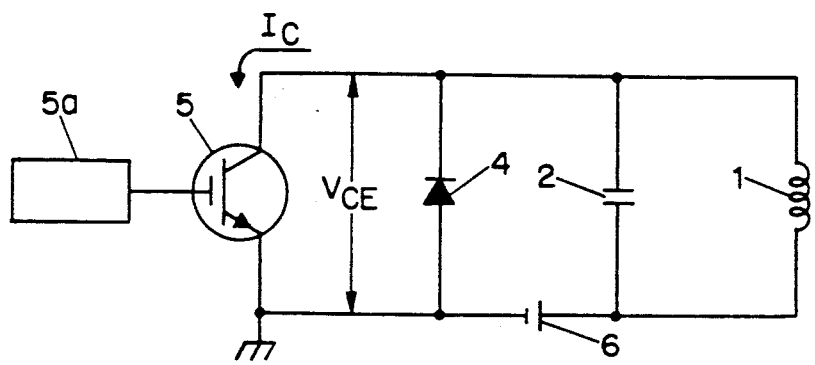
FIG. 5 shows a circuit diagram of a hypothetical horizontal deflection circuit useful in discussing the invention.

The picture quality of television sets and video display units has recently been improved, but as a result there has been an increase in the horizontal deflection frequency from the conventional level of 15.75 kHz to high frequency levels in the range of 30–60 kHz. This increase has made it difficult to achieve high frequency switching using a bipolar transistor for a switching element due to inherent limitations in its performance. To solve this problem, the use of the conductivity modulation MOS FET (also called IGBT) with its high frequency handling characteristics could be attempted. FIG. 5 shows a hypothetical circuit which would use a conductivity modulation MOS FET for the switching element 5. The other components are the horizontal deflection coil 1, tuning capacitor 2 and damper diode 4. The number 5a indicates the control unit of this circuit. The operation of this circuit would be basically the same as that of the circuit in FIG. 9 described above.

Figure 6:
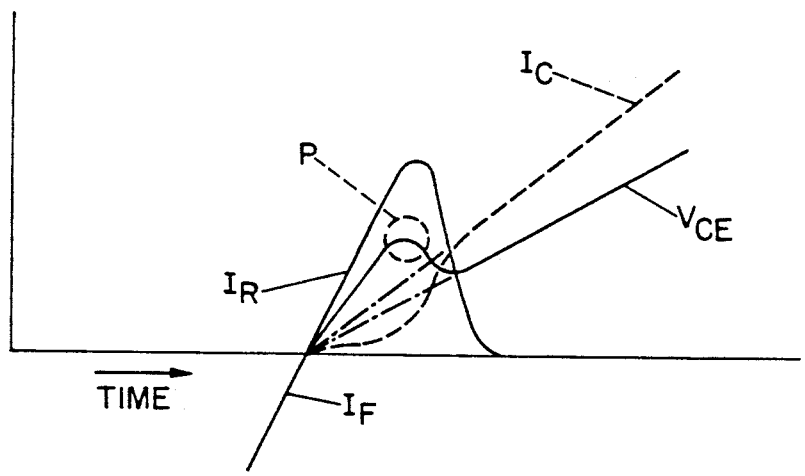
FIGS. 6 and 7 are drawings showing performance characteristics of the FIG. 5 circuit.
Figure 7:
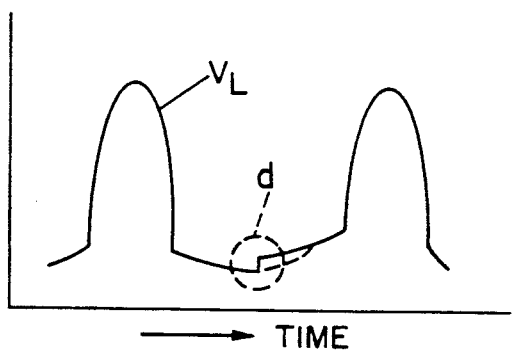
Figure 8:
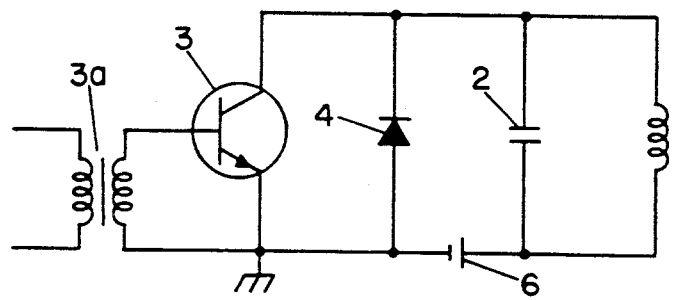
FIG. 8 shows a circuit diagram of a conventional horizontal deflection circuit.

A problem with this hypothetical circuit attempting to make use of a conductivity modulation MOS FET is that conductivity modulation occurs in the high resistivity layer of the semiconductor element. It takes 100-200 ns to reduce the resistance between the collector and emitter of this MOS FET. Consequently, during the turn-on action of the conductivity modulation MOS FET in the circuit shown in FIG. 5, the rise of the collector current IC is delayed as shown in FIG. 6. During this delay, as shown in FIG. 7, distortion d appears in voltage $V_L$ of the horizontal deflection coil, which causes noise to appear on the TV screen or video display unit screen. As a result, the improved frequency characteristics of the MOS FET are overshadowed by the disadvantages of distortion in deflection circuit operation.

Figure 1:
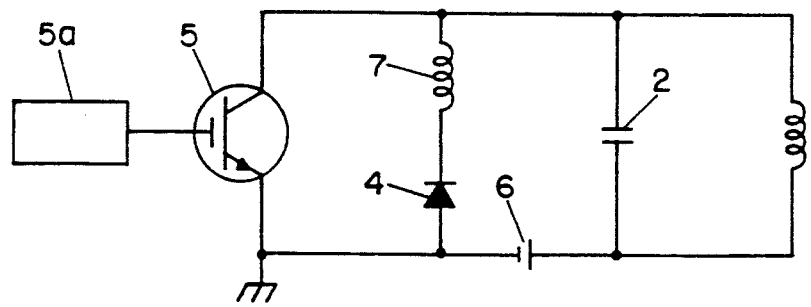
FIG. 1 shows a circuit diagram of a first embodiment of a horizontal deflection circuit in accordance with the present invention.

Referring now to FIG. 1, there is illustrated one embodiment of a horizontal deflection circuit in accordance with the present invention which provides a solution to this problem. As shown, the deflection circuit includes a horizontal deflection coil 1 and a tuning capacity shown as capacitor 2 coupled across the deflection coil. The FIG. 1 circuit further includes diode means, shown as damper diode 4 coupled to the combination of coil 1 and capacitor 2, and a power source 6. The circuit also includes switching means, shown as conductivity modulation MOS FET 5, for coupling power source 6 to the combination of coil 1 and capacitor 2. As shown, switching means 5 is controlled by control signals provided by control unit 5a. In accordance with the invention, the FIG. 1 circuit includes compensation means, shown as inductor 7 coupled in series with diode 4, for delaying an increase in magnitude of current flow during reverse recovery current flow.

Operation will now be described with reference to FIG. 9, wherein FIG. 9(1) shows a waveform of base voltage of MOS FET 5, FIG. 9(2) shows a collector current waveform, FIG. 9(3) shows a waveform of current through horizontal deflection coil 1, FIG. 9(4) shows a current waveform for damper diode 4 and FIG. 9(5) shows a horizontal deflection coil voltage waveform. The conductivity modulation MOS FET 5 is turned on at time $t_6$ (which on a cyclical basis is equivalent to $t_1$). During the period just prior to that time, current in the horizontal deflection coil 1 flows through the damper diode 4, charging the power source 6 (damper current in FIG. 9(4)), and the current gradually decreases to zero. However, as a result of operational circuit constraints the damper diode does not recover its reverse voltage instantly when the current is zero. Instead, as shown in FIG. 6, the damper diode recovers its reverse voltage only after the reverse recovery current $I_R$ flows, reaches the maximum value, then suddenly decreases to zero. While this reverse recovery $I_R$ is flowing, resistance between the collector and emitter of the conductivity modulation MOS FET 5 has decreased to a not yet sufficiently low value after the MOS FET is turned on. In the FIG. 5 circuit this would generate the peak shown at P in FIG. 6 in the voltage between the collector and emitter $V_{CE}$.

Figure 3:
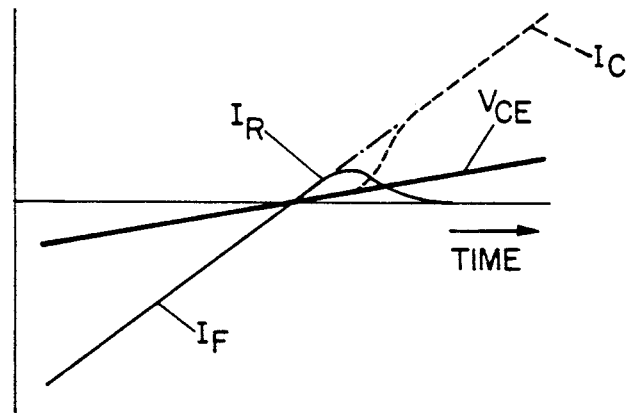
FIG. 3 is a drawing showing performance characteristics of the conductivity modulation MOS FET in the circuits of FIGS. 1 and 2 during turn-on operation.
Figure 4:
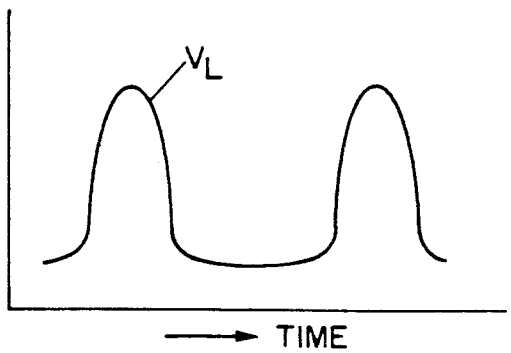
FIG. 4 is a drawing showing performance characteristics of the horizontal deflection coil voltage during operation of the circuits of FIGS. 1 and 2.

In the horizontal deflection circuit of the present invention shown in FIG. 1, the compensation means shown here as inductor 7 is connected in series with the damper diode 4, suppressing a steep rise in the magnitude of the reverse recovery current $I_R$, so as to result in a smooth current with a low peak as shown in FIG. 3. Therefore, peak P is prevented from being generated in the collector/emitter voltage $V_{CE}$, and in accordance with the invention the distortion d shown in FIG. 7 does not occur in voltage $V_L$ of the horizontal deflection coil 1, thereby providing an undistorted deflection coil voltage waveform as shown in FIG. 4.

Figure 2:
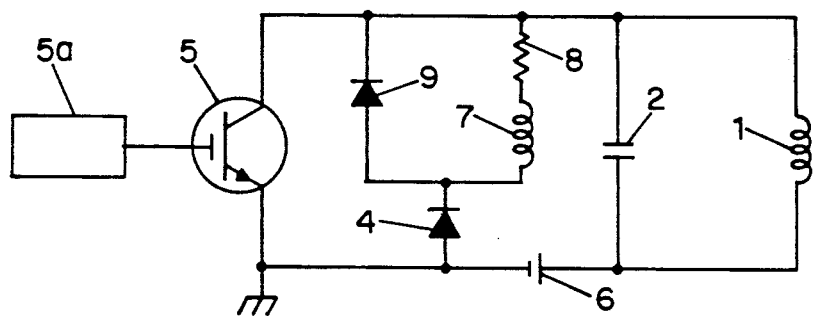
FIG. 2 shows a circuit diagram of a second embodiment of a horizontal deflection circuit in accordance with the present invention.

FIG. 2 shows another embodiment of the present invention. In the circuit in FIG. 1, at time $t_5$ in FIG. 9 when current starts flowing in the damper diode 4, a high current change ($dI_F/dt$) generates high voltage across the terminals of the inductor 7, which in some applications can induce oscillation of the system consisting of the inductor 7 and tuning capacitor 2. In FIG. 2, the compensation means is shown as including inductor 7 and a second diode 9 coupled in parallel with the inductor 7. In the example shown, the circuit also includes a resistance 8 in series with inductor 7. Applicants have found that by connecting diode 9 with the same polarity as the damper diode 4 in parallel with the inductor 7 to bypass current, high voltage is prevented from being generating in the inductor 7 and thereby oscillation is suppressed. To further suppress oscillation, the inclusion of resistor 8 in series with the inductor 7 is effective. A successful result was obtained in an experimental application by using a ferrite-core coil of less than 10 $\mu$H for the inductor 7 and a resistance of 0.1-1.0 ohm for the resistor 8.

In summary, it was found that attempts to use conductivity modulation MOS FET devices in horizontal deflection circuits were unsuccessful because of waveform distortion. The horizontal deflection coil voltage is subject to distortion during the turn-on operation of the conductivity modulation MOS FET because the damper diode current rises steeply and causes reverse recovery current with a high peak to flow before resistance between the collector and emitter of the MOS FET has decreased to a sufficiently low value. This generates an undesirable voltage peak in the collector/emitter voltage $V_{CE}$, which results in a distorted horizontal deflection coil voltage.

In the present invention, compensation means such as an inductor is employed in order to suppress the steep rise of reverse recovery current, resulting in the generation of a current in a smooth shape with a low peak. Therefore, no peak voltage is generated in the collector/emitter voltage $V_{CE}$. Consequently, the horizontal deflection coil voltage no longer has the undesirable distortion. In a different embodiment, a second diode with the same polarity as the damper diode is connected in parallel with the inductor of the compensation means. As a result, when current starts flowing in the damper diode, the second diode operating in parallel with the inductor suppresses the high voltage generated across the inductor terminals by a large current change. Oscillation of the combination consisting of the inductor and tuning capacitor which could otherwise be triggered by such high voltage is therefore suppressed. As a result distortion is eliminated from the horizontal deflection coil voltage.

Thus, by preventing distortion from being generated in the horizontal deflection coil voltage this invention makes possible the use of a conductivity modulation MOS FET with a high frequency characteristic as the switching element in a horizontal deflection circuit. This provides a horizontal deflection circuit applicable to television sets and video display units with the horizontal deflection frequency increased from the conventional 15.75 kHz to 30-60 kHz in order to achieve higher picture quality.

While there have been described what are believed to be the preferred embodiments of the invention, those skilled in the art will recognize that other and further modifications may be made thereto without departing from the invention and it is intended to claim all such changes and modifications as fall within the scope of the invention.

We claim:

1. A horizontal deflection circuit, suitable for use with high frequency scanning rates up to 60 KHz, comprising:

a horizontal deflection coil;
   a capacitor coupled across said horiziontal deflection coil;
   switching means, for coupling a source of power to said horizontal deflection coil and capacitor combination, including a semiconductor device capable of high frequency switching but subject to an inherent delay effect in current switching; and
   a circuit coupled across said switching means including a series combination of diode means for enabling a flow of reverse recovery current during a portion of a deflection cycle and compensation means for delaying an increase in magnitude of current flow through said diode means during said reverse recovery current flow in compensation for said inherent delay effect;
   whereby, distortion of horizontal deflection coil voltage due to said inherent delay effect is avoided by said current increase delay produced by said compensation means.

2. A horizontal deflection circuit according to claim 1, wherein said semiconductor device is a conductivity modulation metal-oxide semiconductor field effect transistor.

3. A horizontal deflection circuit according to claim 1, additionally comprising means for supplying control signals to control the switching action of said switching means.

4. A horizontal deflection circuit according to claim 1, wherein said compensation means is an inductor.

5. A horizontal deflection circuit according to claim 4, wherein said diode means comprises a diode, which is coupled in series with said inductor.

6. A horizontal deflection circuit, for high frequency scanning, comprising:

a horizontal deflection coil;
   a capacitor coupled across said horizontal deflection coil;
   first diode means, coupled to the combination of said horizontal deflection coil and said capacitor, for enabling a flow of reverse recovery current during a portion of a deflection cycle;
   switching means, for coupling a source of power to said horizontal deflection coil and capacitor combination, including a semiconductor device capable of high frequency switching but subject to an inherent delay effect in current switching; and
   compensation means, coupled to said first diode means, comprising an inductor and second diode means coupled in parallel, for delaying an increase in magnitude of current flow through said first diode means during said reverse recovery current flow in compensation for said inherent delay effect;
   whereby, distortion of horizontal deflection coil voltage due to said inherent delay effect is avoided by said current increase delay produced by said compensation means.

7. A horizontal deflection circuit according to claim 6, wherein said semiconductor device is a conductivity modulation metal-oxide semiconductor field effect transistor.

8. A horizontal deflection circuit according to claim 6, additionally comprising means for supplying control signals to control the switching action of said switching means.

9. A horizontal deflection circuit according to claim 6, wherein said compensation means further comprises a resistor coupled in series with said inductor.

10. A horizontal deflection circuit according to claim 6, wherein said second diode means has the same polarity as said first diode means.

11. A horizontal deflection circuit according to claim 6, wherein said horizontal deflection coil is coupled in parallel to said capacitor; and said compensation means is coupled in series with said first diode means and said series combination is coupled in parallel to the combination of said horizontal deflection coil and capacitor.

12. A horizontal deflection circuit, for high frequency scanning, comprising:

a horizontal deflection coil;
   a capacitor coupled in parallel to said horizontal deflection coil;
   first diode means, coupled in parallel to the combination of said horizontal deflection coil and capacitor for enabling a flow of reverse recovery current during a portion of a deflection cycle;
   switching means, for coupling a source of power to said horizontal deflection coil and capacitor combination, said switching means including a conductivity modulation metal-oxide semiconductor field effect transistor capable of high frequency switching but subject to an inherent delay effect in current switching;
   control signal supply means for supplying control signals to control the switching action of said switching means; and
   compensation means, comprising an inductor coupled in series with a resistor and a second diode means coupled in parallel to the combination of said inductor and resistor, said compensation means coupled in series with said first diode means for delaying an increase in magnitude of current flow through said first diode means during said reverse recovery current flow in compensation for said inherent delay effect;
   whereby, distortion of horizontal deflection coil voltage due to said inherent delay effect is avoided by said current increase delay produced by said compensation means.

* * * * *

UNITED STATES PATENT AND TRADEMARK OFFICE
CERTIFICATE OF CORRECTION

PATENT NO. : 5,068,581

DATED : November 26, 1991

INVENTOR(S) : Nishiura et al.

It is certified that error appears in the above-identified patent and that said Letters Patent is hereby corrected as shown below:

<u>Column 1, line 46</u>, "t6" should read --$t_6$--;

<u>Column 6, lines 33-34</u>, "deflection coil; a horizontal" should read --a horizontal deflection coil;--.

Signed and Sealed this

Eighth Day of June, 1993

Attest:

MICHAEL K. KIRK

Attesting Officer

Acting Commissioner of Patents and Trademarks